United States Patent
Fang

(10) Patent No.: US 10,804,172 B2
(45) Date of Patent: Oct. 13, 2020

(54) SEMICONDUCTOR PACKAGE DEVICE WITH THERMAL CONDUCTING MATERIAL FOR HEAT DISSIPATION

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/215,372

(22) Filed: Dec. 10, 2018

(65) Prior Publication Data

US 2020/0185286 A1    Jun. 11, 2020

(51) Int. Cl.
| | |
|---|---|
| H01L 23/02 | (2006.01) |
| H01L 23/053 | (2006.01) |
| H01L 23/31 | (2006.01) |
| H01L 21/56 | (2006.01) |
| H01L 21/52 | (2006.01) |
| H01L 23/42 | (2006.01) |

(52) U.S. Cl.
CPC ............ *H01L 23/053* (2013.01); *H01L 21/52* (2013.01); *H01L 21/56* (2013.01); *H01L 23/3128* (2013.01); *H01L 23/42* (2013.01)

(58) Field of Classification Search
CPC ......... H01L 23/02; H01L 23/04; H01L 23/10; H01L 23/3142; H01L 2225/06537; H01L 2924/3025
See application file for complete search history.

(56) References Cited

U.S. PATENT DOCUMENTS

| | | | |
|---|---|---|---|
| 9,040,351 B2 | 5/2015 | Kwon et al. | |
| 2018/0350755 A1* | 12/2018 | Huang | ................ H01L 23/3737 |
| 2019/0067205 A1* | 2/2019 | Rae | ..................... H01L 23/3735 |
| 2020/0006181 A1* | 1/2020 | Chen | ................... H01L 23/3128 |

* cited by examiner

*Primary Examiner* — Hoai V Pham
(74) *Attorney, Agent, or Firm* — Foley & Lardner LLP

(57) ABSTRACT

A semiconductor package device includes a substrate, an electronic component, a ring frame, an encapsulant, a thermal conducting material and a lid. The electronic component is disposed on the substrate. The ring frame is disposed on the substrate and surrounds the electronic component. The encapsulant encapsulates the electronic component and a first portion of the ring frame. The encapsulant exposes a second portion of the ring frame. The encapsulant and the second portion of the ring frame define a space. The thermal conducting material is disposed in the space. The lid is disposed on the thermal conducting material and connects with the second portion of the ring frame.

19 Claims, 16 Drawing Sheets

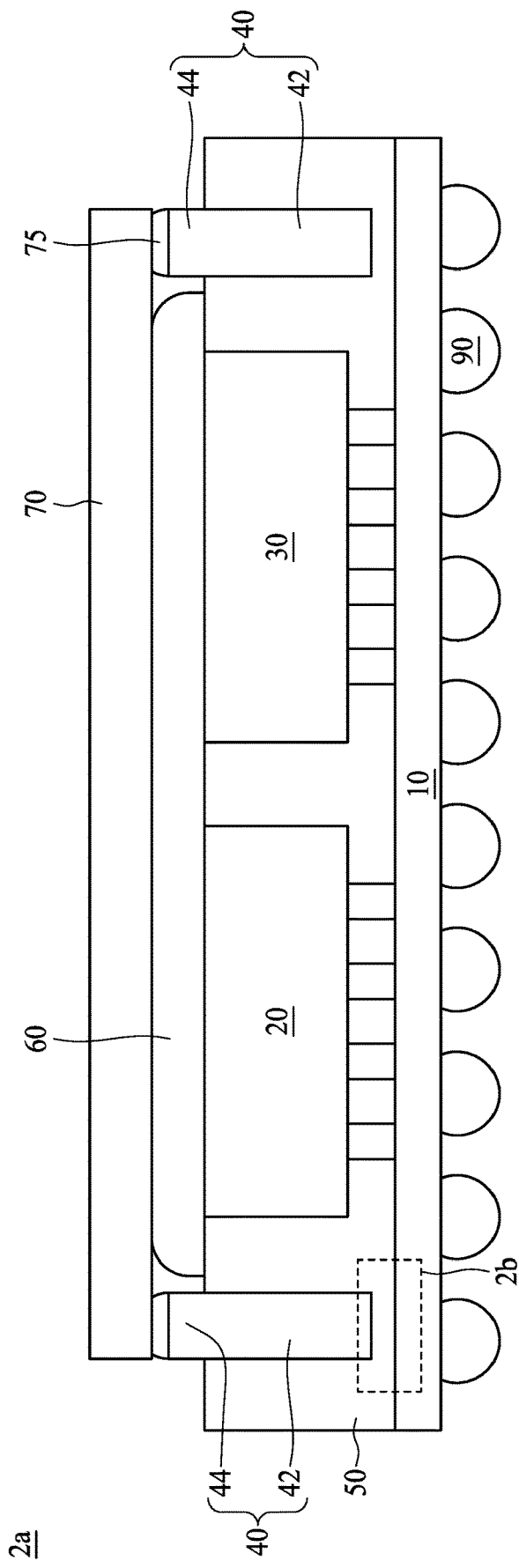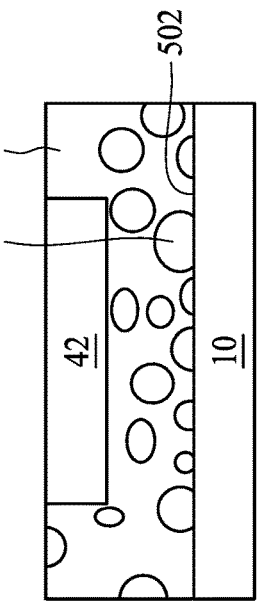
FIG. 2A
FIG. 2B

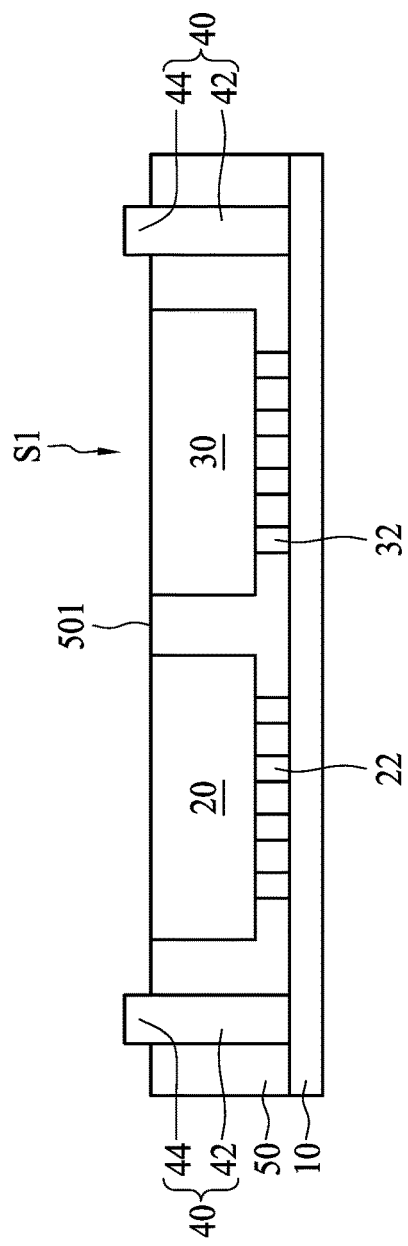
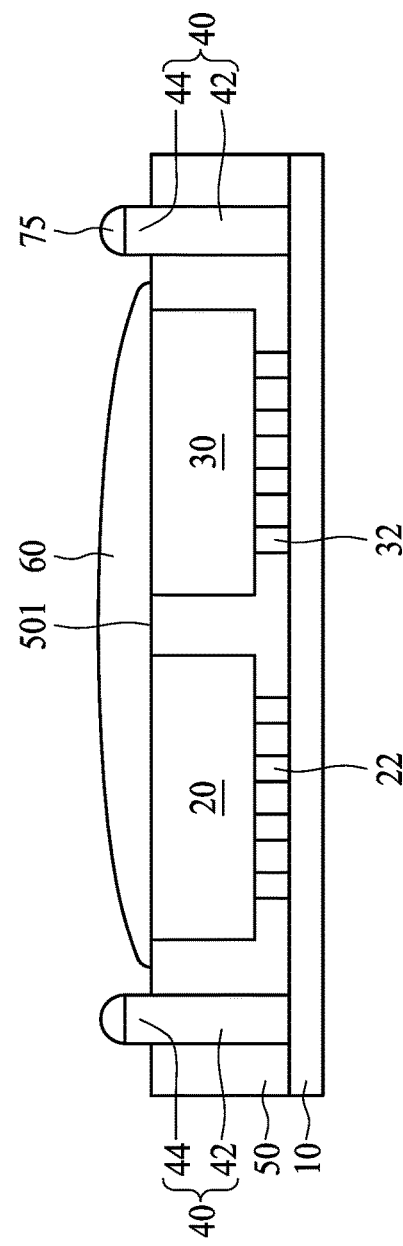
FIG. 4I
FIG. 4J

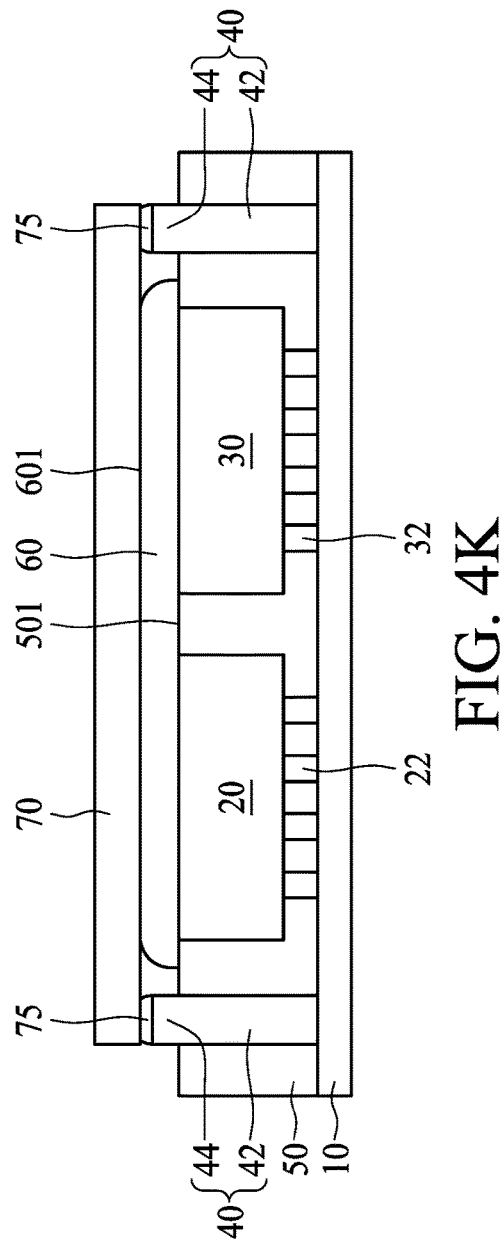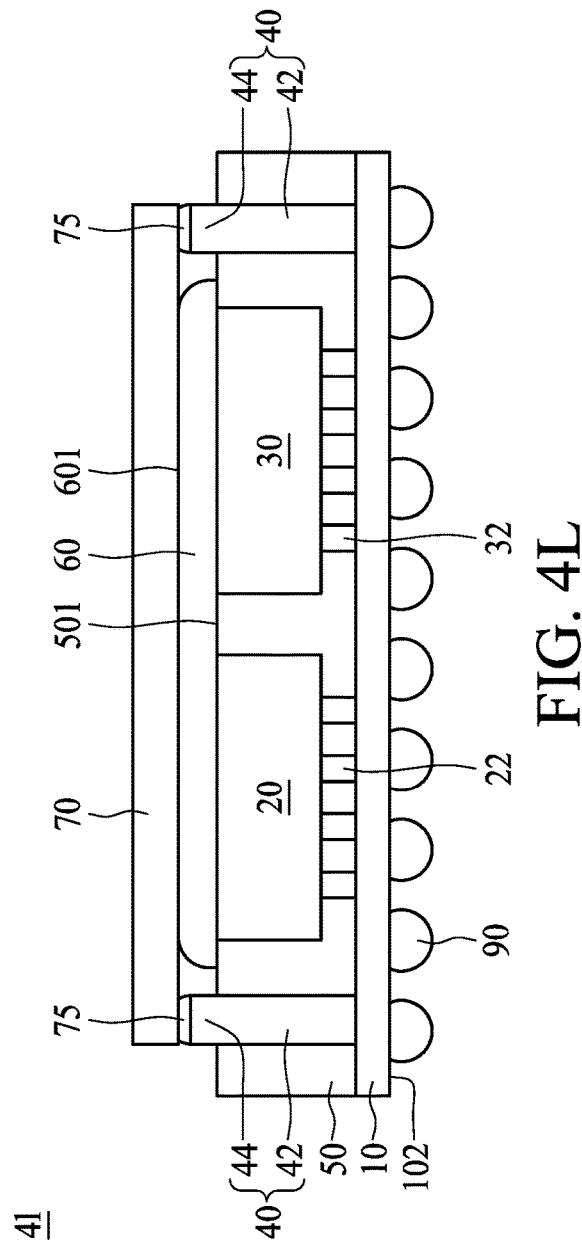

SEMICONDUCTOR PACKAGE DEVICE WITH THERMAL CONDUCTING MATERIAL FOR HEAT DISSIPATION

BACKGROUND

1. Technical Field

The present disclosure relates generally to a semiconductor package device, and more particularly, the present disclosure relates to a semiconductor package device including a heat dissipation structure and a method of manufacturing the same.

2. Description of the Related Art

Heat dissipation has become increasingly important for various electronic devices. Thermal conducting material is often used between a semiconductor die/component and a heat dissipating structure such as a heat sink. However, due to temperature cycles during the manufacturing process, a portion of the thermal conducting material may melt and dissipate away, and the remaining portion of the thermal conducting material between the semiconductor die/component and the heat dissipating structure may be insufficient for heat dissipation.

SUMMARY

In one aspect, according to some embodiments, a semiconductor package device includes a substrate, an electronic component, a ring frame, an encapsulant, a thermal conducting material and a lid. The electronic component is disposed on the substrate. The ring frame is disposed on the substrate and surrounds the electronic component. The encapsulant encapsulates the electronic component and a first portion of the ring frame. The encapsulant exposes a second portion of the ring frame. The encapsulant and the second portion of the ring frame define a space. The thermal conducting material is disposed in the space. The lid is disposed on the thermal conducting material and connects with the second portion of the ring frame.

In another aspect, according to some embodiments, a semiconductor package device includes a substrate, an electronic component, an encapsulant, a barrier cap and a thermal conducting material. The electronic component is disposed on the substrate. The encapsulant encapsulates the electronic component. The barrier cap is disposed on the encapsulant. The barrier cap and the encapsulant define a space. The thermal conducting material is disposed within the space.

In yet another aspect, according to some embodiments, a method of manufacturing a semiconductor package device includes providing a carrier within a release film thereon, forming a ring frame on the release film, wherein a first end of the ring frame is inserted into the release film, forming an encapsulant to encapsulate the ring frame, forming a redistribution layer on the encapsulant, removing the carrier and the release film to form an accommodating space between the encapsulant and the first end of the ring frame, and disposing a thermal conducting material in the accommodating space.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

FIG. 2A illustrates a cross-sectional view of a semiconductor package device in accordance with some embodiments of the present disclosure.

FIG. 2B illustrates an enlarged view of a portion of the semiconductor package device in FIG. 2A.

FIG. 4A, FIG. 4B, FIG. 4C, FIG. 4D, FIG. 4E, FIG. 4F, FIG. 4G, FIG. 4H, FIG. 4I, FIG. 4J, FIG. 4K and FIG. 4L are cross-sectional views of a semiconductor package device fabricated at various stages, in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

According to some embodiments of the present disclosure, by forming a barrier structure such as a ring frame or a lid around a thermal conducting material, the thermal conducting material can be contained between a semiconductor die/component and a heat dissipating structure during various operations of the manufacturing process, and the heat dissipation performance can be enhanced.

Figures 1A, 1B:
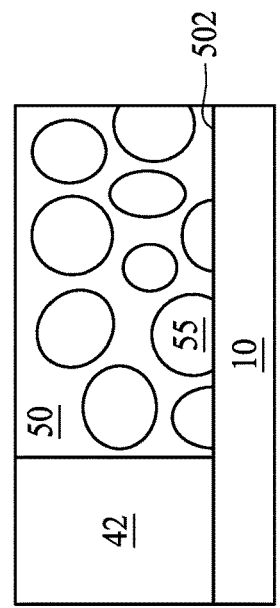
FIG. 1A illustrates a cross-sectional view of a semiconductor package device in accordance with some embodiments of the present disclosure.
FIG. 1B illustrates an enlarged view of a portion of the semiconductor package device in FIG. 1A.

FIG. 1A illustrates a cross-sectional view of a semiconductor package device 1a in accordance with some embodiments of the present disclosure.

The semiconductor package device 1a includes a substrate 10, electronic components 20 and 30, a ring frame 40, an encapsulant 50, a thermal conducting material 60, a lid 70 and connection elements 90.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the grounding element is a via exposed from a surface of the substrate 10. In some embodiments, the grounding element is a metal layer exposed from a surface of the substrate 10. In some embodiments, the grounding element is a metal trace exposed from a surface of the substrate 10.

The electronic component 20 is disposed on the substrate 10. The electronic component 20 may be electrically connected to the substrate 10 through conductive elements 22. The electronic component 20 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 30 is disposed on the substrate 10 and next to the electronic component 20. The electronic component 30 may be electrically connected to the substrate 10 through conductive elements 32. In some embodiments, the electronic component 30 has similar features as the electronic component 20.

The ring frame 40 is disposed on the substrate 10. The ring frame 40 surrounds the electronic component 20 and the electronic component 30. The ring frame 40 may have a ring shape. The ring frame 40 may have a closed contour from a top view perspective. The ring frame 40 may have a circular, a square (as will be shown in FIG. 1C) or any suitable shape according to various applications. The ring frame 40 has a portion 42 and a portion 44. The portion 42 is covered or encapsulated by the encapsulant 50. The portion 44 is exposed from the encapsulant 50.

The ring frame 40 may include conductive material, for example, the ring frame 40 may include, aluminum (Al), copper (Cu), chromium (Cr), tin (Sn), gold (Au), silver (Ag), nickel (Ni) or stainless steel, or a mixture, an alloy, or other combination thereof. In some embodiments, the ring frame 40 is electrically connected to the substrate 10. The ring frame 40 may be grounded through a grounding element in the substrate 10. The ring frame 40 may function as an electromagnetic interference (EMI) shielding structure for the electronic component 20 and the electronic component 30. In some embodiments, the ring frame 40 may not include conductive material. In the embodiment shown in FIG. 1A, the ring frame 40 is in contact with the substrate 10. The ring frame 40 may support the overall structure of the semiconductor package device 1a and reduce warpage during manufacturing of the semiconductor package device 1a.

The encapsulant 50 is disposed on the substrate 10 and encapsulates the electronic components 20 and 30. A portion of the electronic component 20 and a portion of the electronic component 30 are exposed from the encapsulant 50. For example, a surface 201 (e.g., a backside surface) of the electronic component 20 and a surface 301 (e.g., a backside surface) of the electronic component 30 are exposed from the encapsulant 50. For example, the surface 201 of the electronic component 20 and the surface 301 of the electronic component 30 are substantially coplanar with the surface 501 of the encapsulant 50. The encapsulant 50 encapsulates or surrounds the portion 42 of the ring frame 40. The encapsulant 50 exposes the portion 44 of the ring frame 40. The portion 44 of the ring frame 40 protrudes beyond the encapsulant 50. The encapsulant 50 and the portion 44 of the ring frame 40 define a space S1. The encapsulant 50 may include an epoxy resin having fillers, a molding compound (e.g., an epoxy molding compound or other molding compound), a polyimide, a phenolic compound or material, a material with a silicone dispersed therein, or a combination thereof.

Figure 1C:
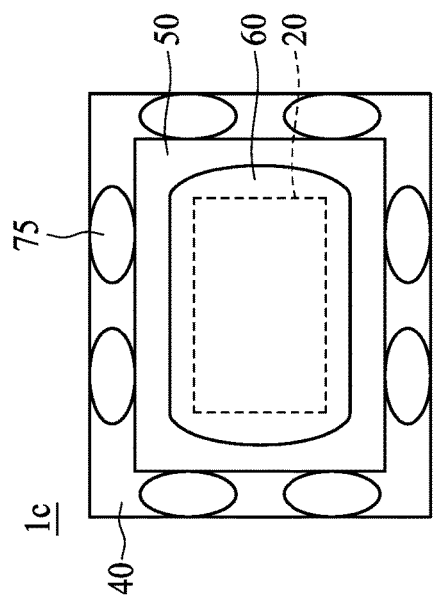
FIG. 1C illustrates a top view of a semiconductor package device in accordance with some embodiments of the present disclosure.

The thermal conducting material 60 (or thermal interface material) is disposed in the space S1. The thermal conducting material 60 may not fully fill the space S1. For example, there may be a gap between the thermal conducting material 60 and the ring frame 40. That is, a volume of the space S1 is greater than a volume of the thermal conducting material 60. In some embodiments, a ratio of the volume of the space S1 to the volume of the thermal conducting material 60 is between 1.2 and 1.5. The thermal conducting material 60 is disposed on a surface 501 of the encapsulant 50. The thermal conducting material 60 is disposed on the surface 201 of the electronic component 20 and/or the surface 301 of the electronic component 30. The thermal conducting material 60 is in contact with the surface 201 of the electronic component 20 and/or the surface 301 of the electronic component 30. In the embodiment shown in FIG. 1A, the thermal conducting material 60 is fully in contact with or fully covers the surface 201 of the electronic component 20 and the surface 301 of the electronic component 30. The thermal conducting material 60 is surrounded by the portion 44 of the ring frame 40. In some embodiments, the thermal conducting material 60 is fully surrounded by the portion 44 of the ring frame 40. For example, the portion 44 of the ring frame 40 may have a continuous contour fully surrounding the thermal conducting material 60 from a top view perspective (as shown in FIG. 1C).

The lid 70 is disposed on the thermal conducting material 60 and the ring frame 40. The lid 70 is in contact with the thermal conducting material 60. As shown in FIG. 1A, the thermal conducting material 60 has a surface 601 contacting or fully contacting the lid 70. The electronic component 20 and/or the electronic component 30 are within a contour of the surface 601 of the thermal conducting material 60 from a top view perspective. The lid 70 may include conductive material, for example, the lid 70 may include, Al, Cu, Cr, Sn, Au, Ag, Ni or stainless steel, or a mixture, an alloy, or other combination thereof. The lid 70 may include or may be a heat sink, a heat spreader or any other suitable heat dissipating structure.

The lid 70 connects with the portion 44 of the ring frame 40. In the embodiment shown in FIG. 1A, the lid 70 connects with the portion 44 of the ring frame 40 by an adhesive material 75. The adhesive material 75 may be disposed continuously between the portion 44 of the ring frame and the lid 70. For example, the adhesive material 75 may form a continuous contour surrounding the thermal conducting material 60 from a top view perspective. In some embodiments, the adhesive material 75 may be disposed discontinuously between the portion 44 of the ring frame and the lid 70. For example, the adhesive material 75 may be partially disposed between the portion 44 of the ring frame and the lid 70 (as shown in FIG. 1C). In some embodiments, the lid 70 may be electrically connected to the ring frame 40. In some embodiments, the lid 70 may be grounded through the ring frame 40. In some embodiments, the lid 70 and the ring frame 40 may provide EMI shielding for the electronic components 20 and 30.

As shown in FIG. 1A, a distance H1 between the encapsulant 50 and the lid 70 is greater than a distance (or height, length) H2 of the portion 44 of the ring frame 40 exposed from the encapsulant 50. In some embodiments, a ratio of the distance H2 to the distance H1 is greater than 0.7, e.g., between 0.7 and 1. The configuration may prevent the thermal conducting material 60 from flowing out of the ring frame 40 during manufacturing of the semiconductor package device 1a.

The connection elements 90 are disposed on a surface 101 of the substrate 10. The connection elements 90 are electrically connected to conductive lines, traces, vias or pillars in the substrate 10. The connection elements 90 may include solder balls.

FIG. 1B illustrates an enlarged view of a portion 1b of the semiconductor package device 1a in FIG. 1A. As shown in FIG. 1B, the encapsulant 50 includes fillers 55. In the vicinity of an interface 502 (which is also a surface of the encapsulant 50) between the encapsulant 50 and the substrate 10, some fillers 55 are intersected by the interface 502 and have a surface coplanar with the interface 502. In contrast, in some embodiments, fillers of the encapsulant 50 in the vicinity of the surface 501 (referring to FIG. 1A) may be complete and may not be intersected by the surface 501.

FIG. 1C illustrates a top view of a semiconductor package device 1c in accordance with some embodiments of the present disclosure. The semiconductor package device 1c may have similar features as the semiconductor package device 1a in FIG. 1A. The lid 70 is omitted for clarity. As shown in FIG. 1C, the ring frame 40 has a continuous contour surrounding the thermal conducting material 60. The adhesive material 75 is disposed discontinuously or partially along the contour of the ring frame 40 that surrounds the thermal conducting material 60. The electronic component 20 is fully covered by the thermal conducting material 60.

Figure 1D:
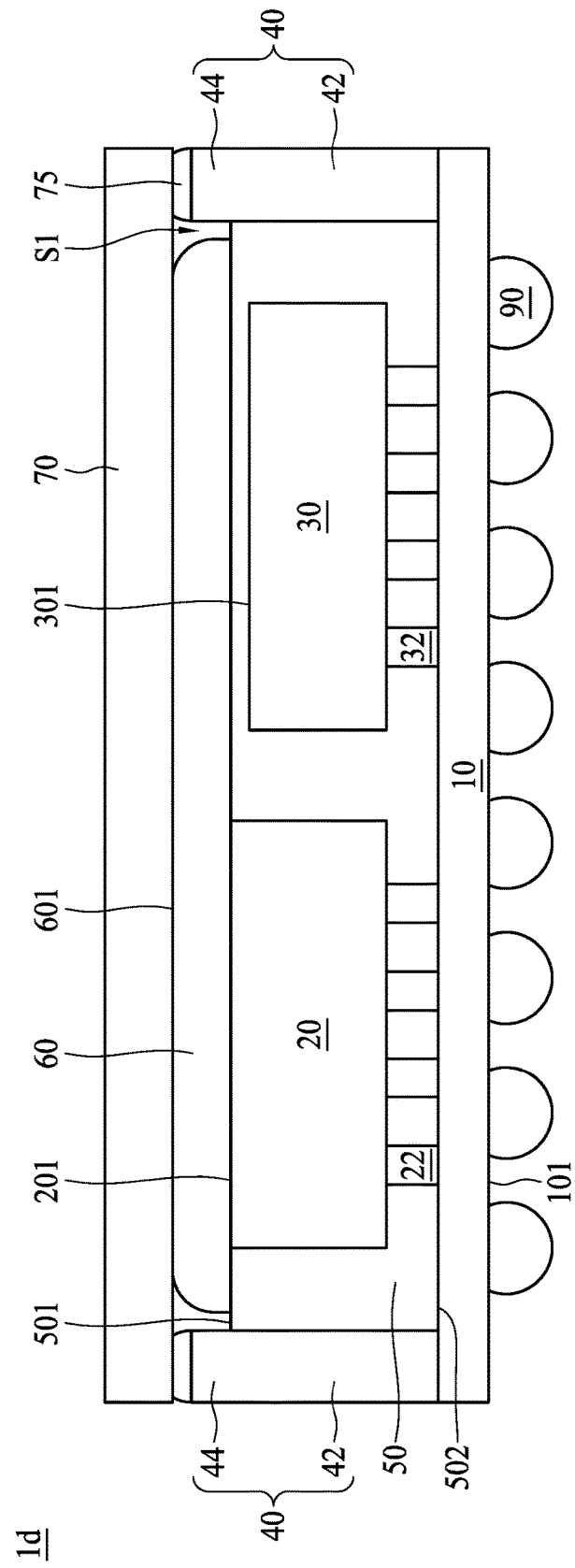
FIG. 1D illustrates a cross-sectional view of a semiconductor package device in accordance with some embodiments of the present disclosure.

FIG. 1D illustrates a cross-sectional view of a semiconductor package device 1d in accordance with some embodiments of the present disclosure. The semiconductor package device 1d is similar to the semiconductor package device 1a in FIG. 1A with some differences described below.

The encapsulant 50 and the substrate 10 do not extend beyond a lateral surface of the ring frame 40. Therefore, a size of the semiconductor package device 1d may be smaller than a size of the semiconductor package device 1a in FIG. 1A. In addition, the surface 301 of the electronic component 30 is not exposed from the encapsulant 50.

According to the configuration of some embodiments of the present disclosure, the thermal conducting material 60 is confined by the portion 44 of the ring frame 40 to cover (or fully cover) the electronic component 20 and/or the electronic component 30. Because of the configuration of the ring frame 40, the thermal conducting material 60 would not flow away from the area of the electronic component 20 and/or the electronic component 30 due to temperature cycles during manufacturing processes. The configuration may improve the heat dissipation through the thermal conducting material 60 and the lid 70, which may be a heat sink, a heat spreader or any other suitable heat dissipating structure.

FIG. 2A illustrates a cross-sectional view of a semiconductor package device 2a in accordance with some embodiments of the present disclosure. The semiconductor package device 2a is similar to the semiconductor package device 1a in FIG. 1A with some differences described below.

The ring frame 40 is not in contact with the substrate 10. The ring frame 40 (or the portion 42 of the ring frame 40) is spaced apart from the substrate 10 by a portion of the encapsulant 50. In some embodiments, because the ring frame 40 is not in contact with the substrate 10, stresses that may accumulate in a connection point between the substrate 10 and the portion 42 of the ring frame 40 can be prevented. The stresses may result from temperature cycles, coefficient of thermal expansion (CTE) mismatches between different materials, warpage and/or deformation during various manufacturing processes.

FIG. 2B illustrates an enlarged view of a portion 2b of the semiconductor package device 2a in FIG. 2A. As shown in FIG. 2B, the encapsulant 50 includes fillers 55. In the vicinity of an interface 502 (which is also a surface of the encapsulant 50) between the encapsulant 50 and the substrate 10, some fillers 55 are intersected by the interface 502 and have a surface coplanar with the interface 502.

Figure 3A:
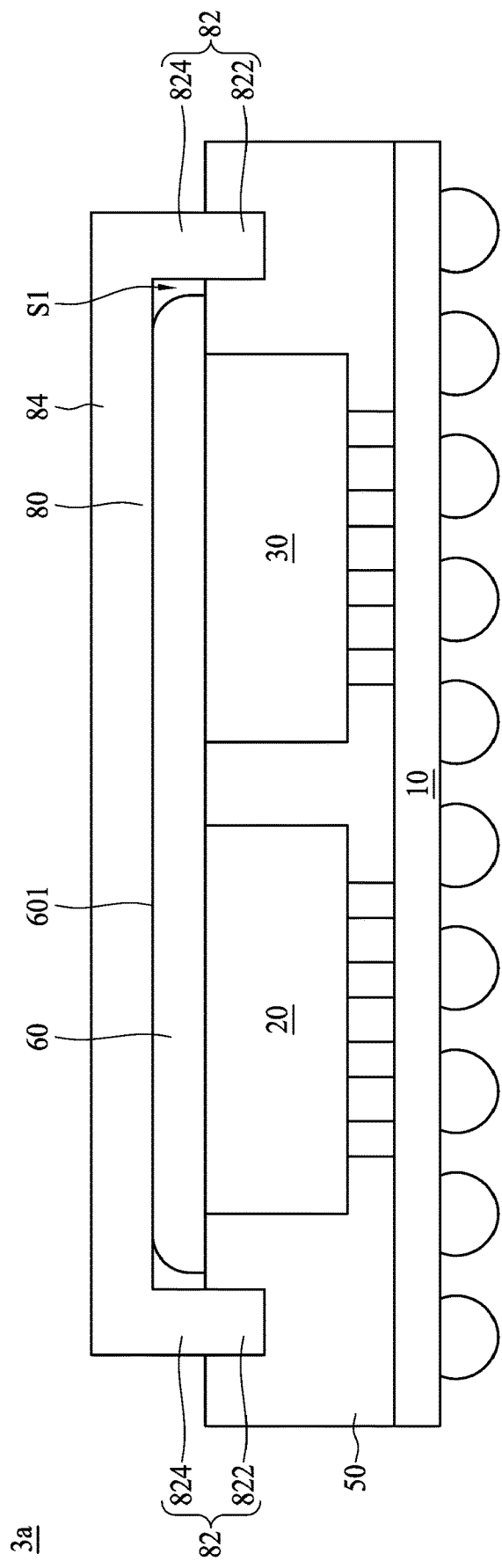
FIG. 3A illustrates a cross-sectional view of a semiconductor package device in accordance with some embodiments of the present disclosure.

FIG. 3A illustrates a cross-sectional view of a semiconductor package device 3a in accordance with some embodiments of the present disclosure. The semiconductor package device 3a is similar to the semiconductor package device 1a in FIG. 1A and/or the semiconductor package device 2a in FIG. 2A with some differences described below.

The combination of the lid 70 and the ring frame 40 are omitted. A barrier cap 80 is disposed on the encapsulant 50 and the thermal conducting material 60. The barrier cap 80 and the encapsulant 50 define a space S1 accommodating the thermal conducting material 60. The barrier cap 80 is in contact with the thermal conducting material 60. In some embodiments, a surface 601 of the thermal conducting material 60 is fully in contact with the barrier cap 80 and fully covers the electronic component 20 and/or the electronic component 30.

The barrier cap 80 includes a ring frame 82 and a lid 84. The ring frame 82 includes a portion 822 disposed in the encapsulant 50 and a portion 824 exposed from the encapsulant 50. The portion 822 of the barrier cap 80 extends into or protrudes into the encapsulant 50. In the embodiment shown in FIG. 3A, the portion 822 of the barrier cap 80 is spaced apart from the substrate 10 by a portion of the encapsulant 50. In some other embodiments, the portion 822 of the barrier cap 80 may contact the substrate 10.

The barrier cap 80 may include conductive material, for example, the barrier cap 80 may include, Al, Cu, Cr, Sn, Au, Ag, Ni or stainless steel, or a mixture, an alloy, or other combination thereof. The barrier cap 80 may be electrically connected to the substrate 10. The barrier cap 80 may be grounded through a grounding element in the substrate 10. The barrier cap 80 may provide EMI shielding for the electronic components 20 and 30. In some embodiments, the barrier cap 80 may not include conductive material.

FIG. 4A, FIG. 4B, FIG. 4C, FIG. 4D, FIG. 4E, FIG. 4F, FIG. 4G, FIG. 4H, FIG. 4I, FIG. 4J, FIG. 4K and FIG. 4L are cross-sectional views of a semiconductor package device 41 fabricated at various stages, in accordance with some embodiments of the present disclosure. Various figures have been simplified for a better understanding of the aspects of the present disclosure.

Figure 4A:
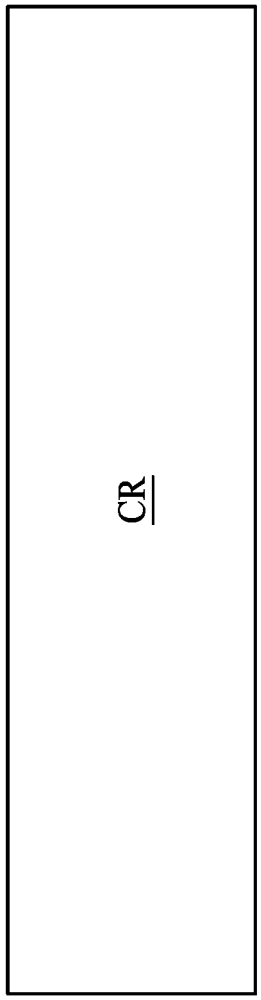
Figure 4B:
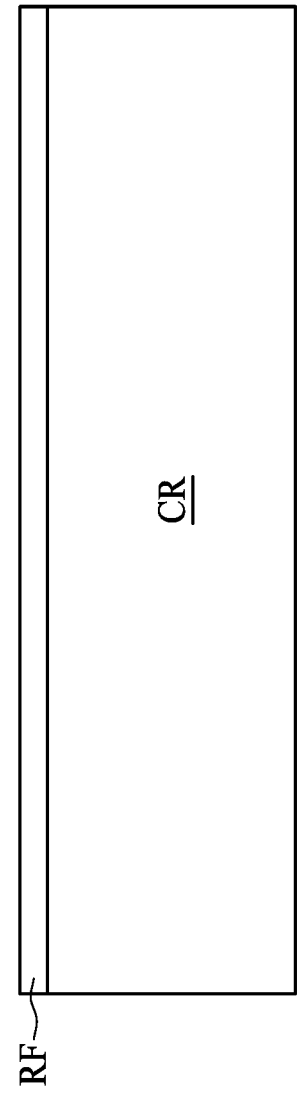
Figure 4C:
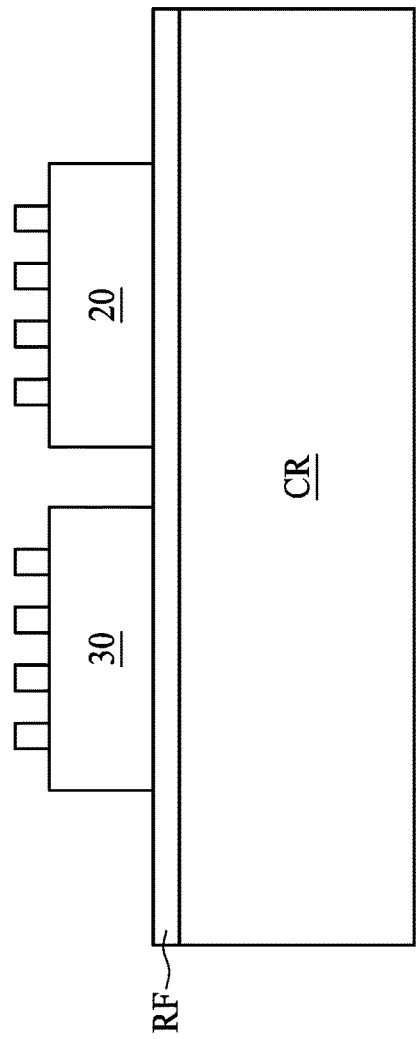
Figure 4D:
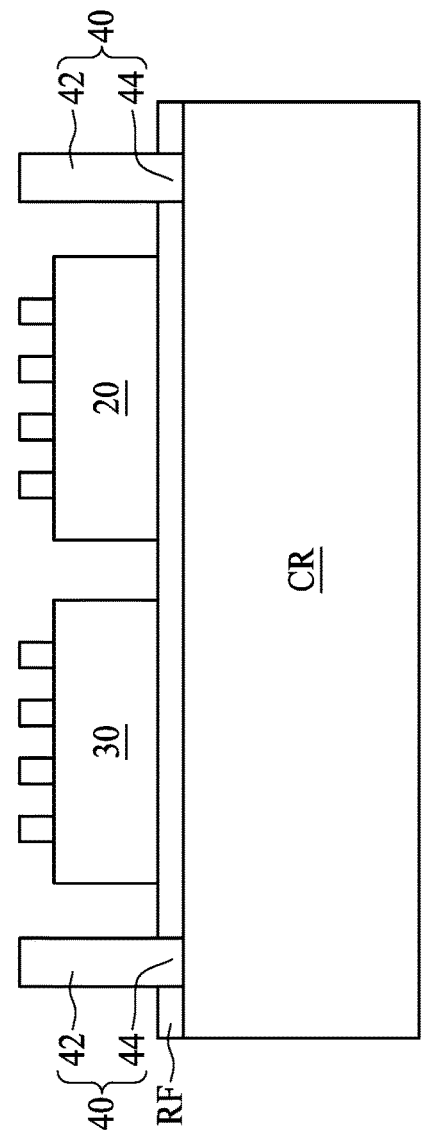

Referring to FIG. 4A, a carrier CR is provided. The carrier CR may include glass or other materials. Referring to FIG. 4B, a release film RF is provided on the carrier CR. Referring to FIG. 4C, electronic components 20 and 30 are disposed on the release film RF. Referring to FIG. 4D, a ring frame 40 is formed or provided on the release film RF. The ring frame 40 includes a portion 42 and a portion 44. The portion 44 (which may be an end of the ring frame 40) is inserted into or protrudes into the release film RF.

Figure 4E:
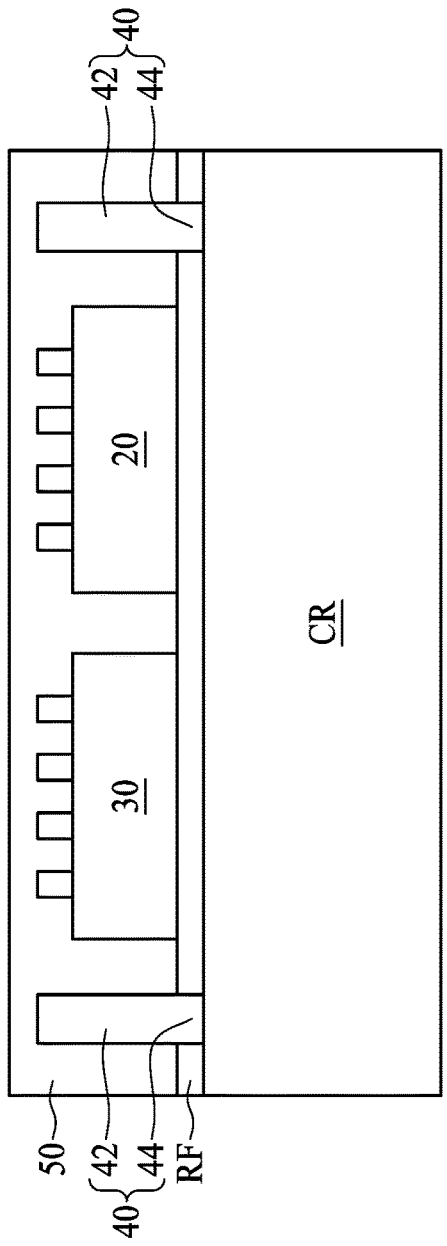
Figure 4F:
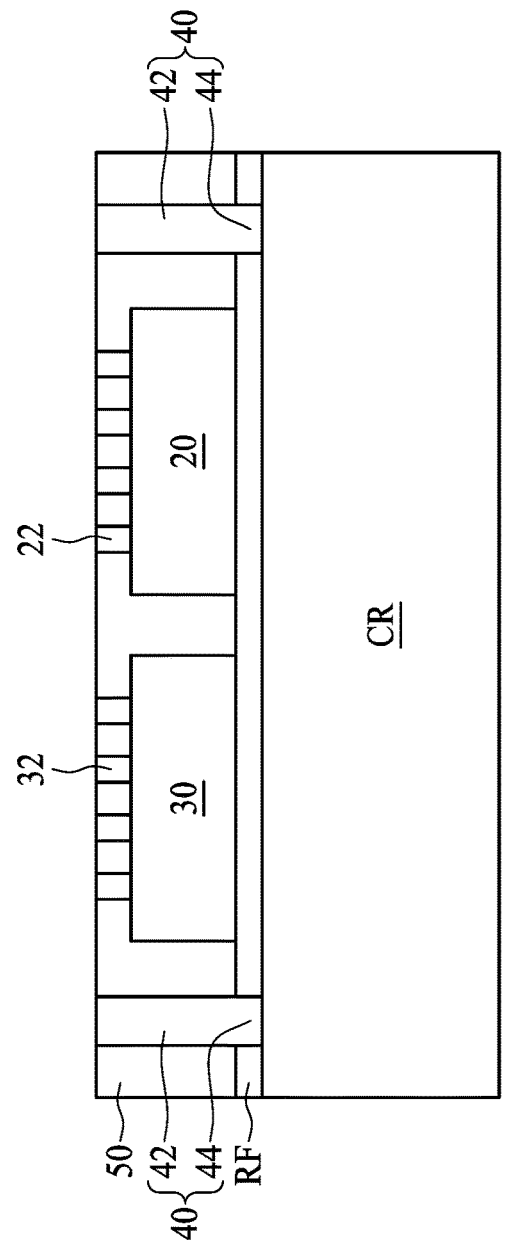

Referring to FIG. 4E, an encapsulant 50 is formed on the release film RF to encapsulate the electronic components 20 and 30 and the ring frame 40. The portion 44 of the ring frame 40 is exposed from the encapsulant 50. The encapsulant 50 may be formed by a molding operation. Referring to FIG. 4F, a grinding operation is performed to remove a portion of the encapsulant 50 to expose conductive elements (or electrical contacts) 22 of the electronic component 20, conductive elements 32 (or electrical contacts) of the electronic component 30, and the portion 42 of the ring frame 40. A portion of the conductive elements 22 of the electronic component 20, a portion of the conductive elements 32 of the electronic component 30, and a portion (or an end) of the portion 42 of the ring frame 40 may be removed by the grinding operation.

Figure 4G:
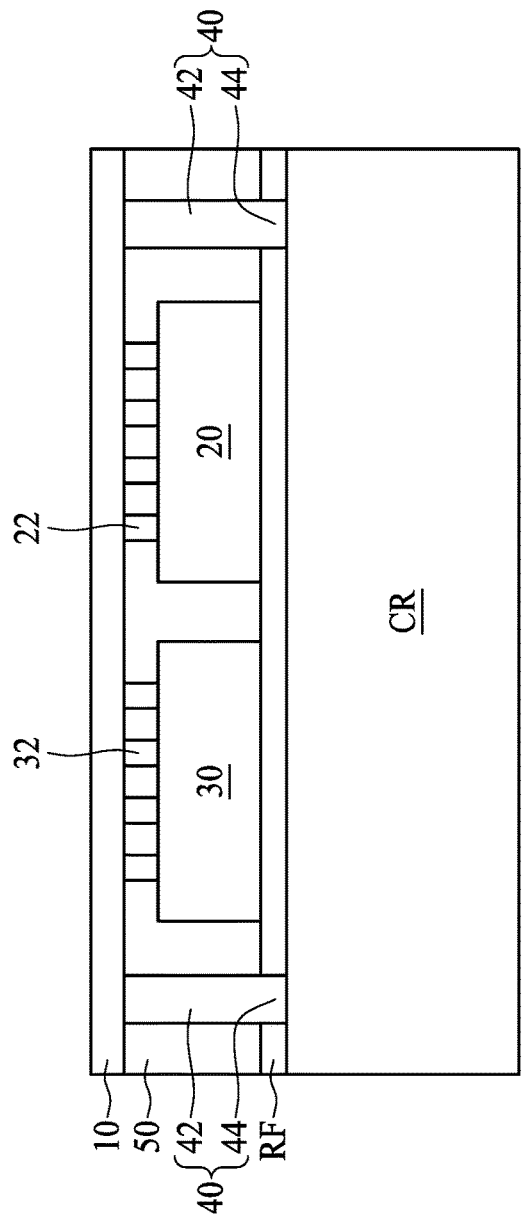

Referring to FIG. 4G, a substrate (which may be or may include a redistribution layer) 10 is disposed on the encapsulant 50, the electronic components 20 and 30, and the ring frame 40. The substrate 10 is in contact with the conductive elements 22 of the electronic components 20, the conductive elements 32 of the electronic components 30, and the ring frame 40. The substrate 10 may be electrically connected to the conductive elements 22 of the electronic components 20, the conductive elements 32 of the electronic components 30, and the ring frame 40.

Figure 4H:
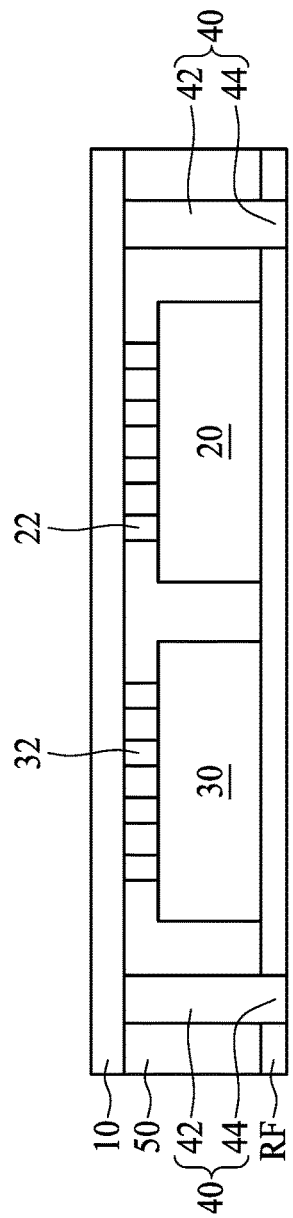

Referring to FIG. 4H, the carrier CR is removed, wherein an ultraviolet operation may be utilized. Referring to FIG. 4I, the release film RF is removed, wherein an ultraviolet operation may be utilized. A space (or accommodating space) S1 is formed between a surface 501 of the encapsulant 50 and the portion 44 of the ring frame 40.

Referring to FIG. 4J, a thermal conducting material 60 is disposed in the space S1. The thermal conducting material 60 is disposed on the electronic components 20 and 30 and the encapsulant 50. The thermal conducting material 60 may be disposed by a dispensing operation. An adhesive material 75 is disposed on the portion 44 of the ring frame 40. The adhesive material 75 may be disposed by a dispensing operation. Referring to FIG. 4K, a lid 70 is disposed on the thermal conducting material 60 and on the portion 44 of the ring frame 40. The lid 70 is disposed on the portion 44 of the ring frame 40 by the adhesive material 75. The thermal conducting material 60 is pressed by the lid 70. The thermal conducting material 60 fully covers the electronic components 20 and 30. A surface 601 of the thermal conducting material 60 is fully in contact with the lid 70 and fully covers the electronic components 20 and 30 from a top view perspective.

Referring to FIG. 4L, connection elements 90 are disposed on a surface 102 of the substrate 10. The connection elements 90 may be disposed by a ball mount process which may include a reflow operation. A semiconductor package device 41 is formed. The semiconductor package device 41 may be similar to or the same as the semiconductor package device 1a of FIG. 1A.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L are cross-sectional views of a semiconductor package device 51 fabricated at various stages, in accordance with some embodiments of the present disclosure. Various figures have been simplified for a better understanding of the aspects of the present disclosure.

Figure 5A:
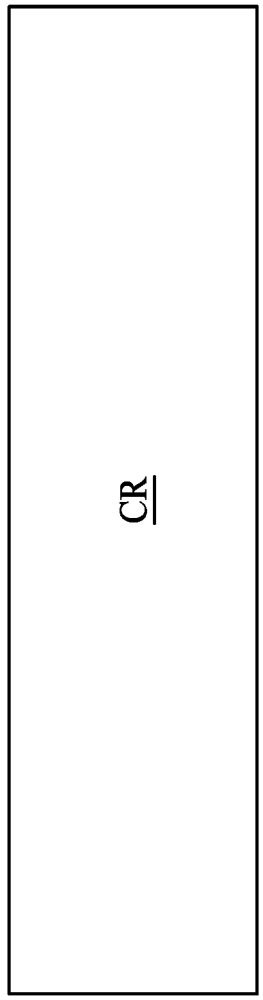
FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L are cross-sectional views of a semiconductor package device fabricated at various stages, in accordance with some embodiments of the present disclosure.
Figure 5B:
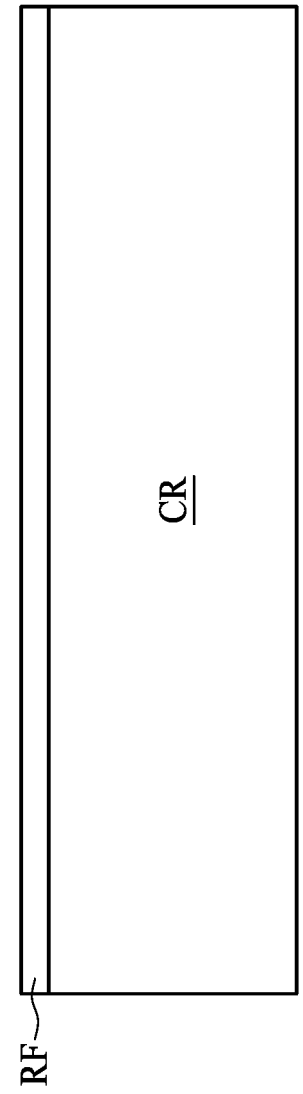
Figure 5C:
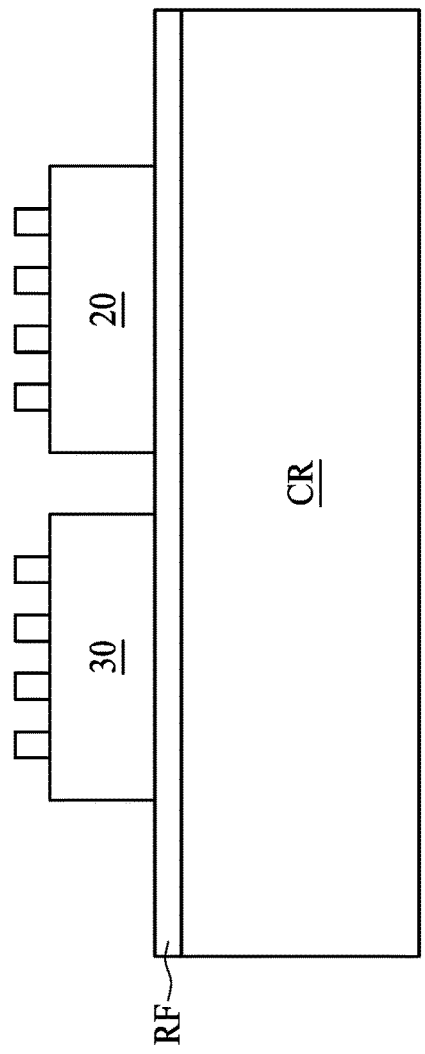
Figure 5D:
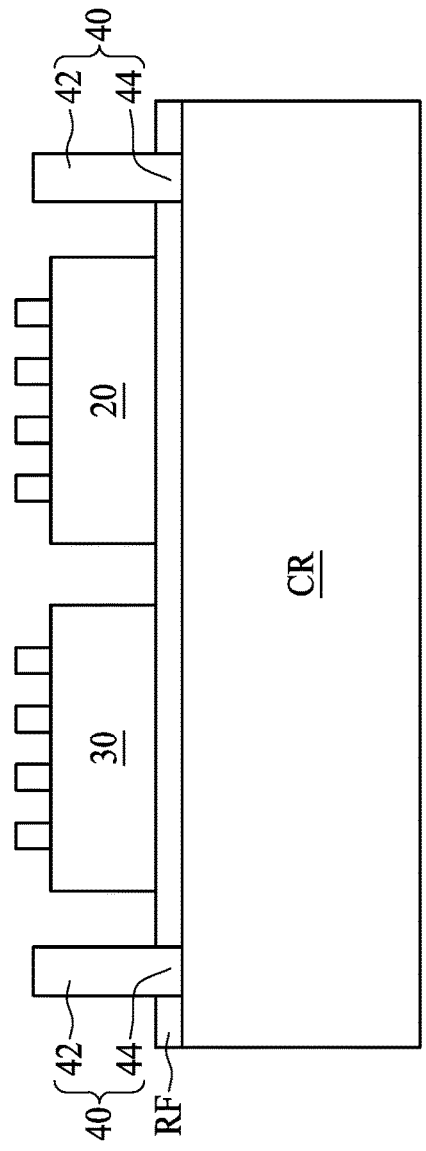

Referring to FIG. 5A, a carrier CR is provided. The carrier CR may include glass or other materials. Referring to FIG. 5B, a release film RF is provided on the carrier CR. Referring to FIG. 5C, electronic components 20 and 30 are disposed on the release film RF. Referring to FIG. 5D, a ring frame 40 is formed or provided on the release film RF. The ring frame 40 includes a portion 42 and a portion 44. The portion 44 (which may be an end of the ring frame 40) is inserted into or protrudes into the release film RF.

Figure 5E:
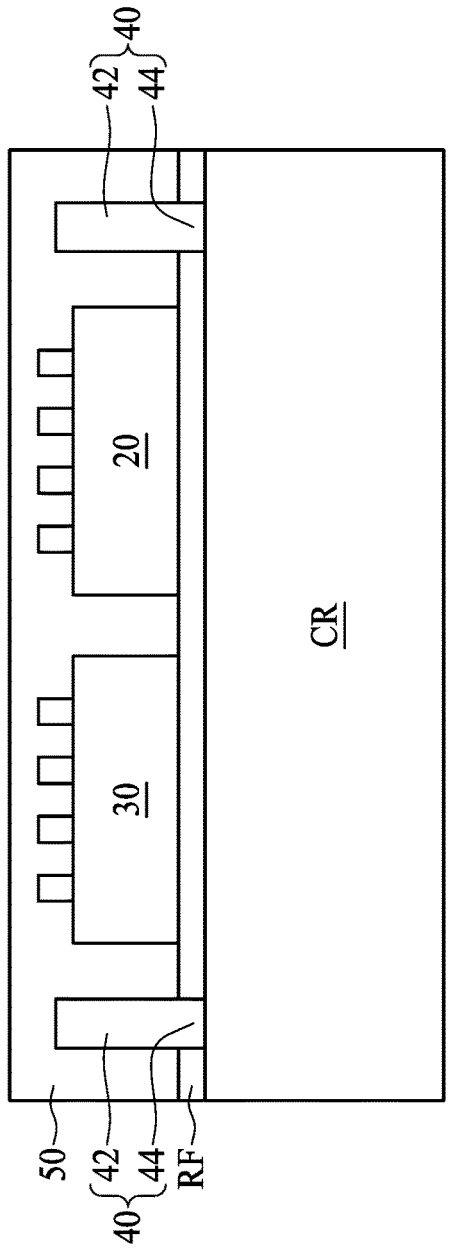
Figure 5F:
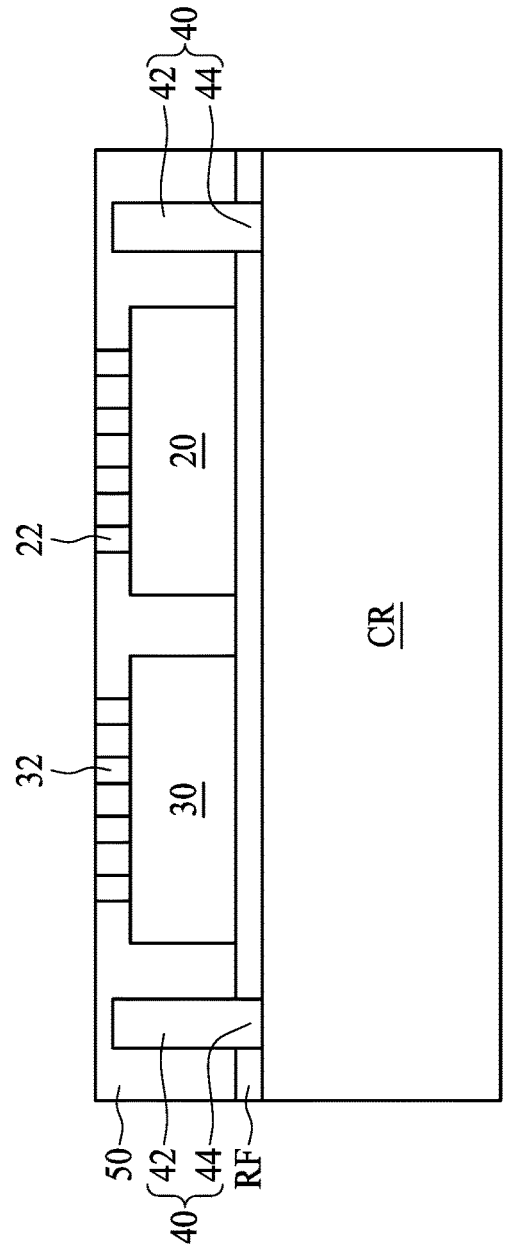

Referring to FIG. 5E, an encapsulant 50 is formed on the release film RF to encapsulate the electronic components 20 and 30 and the ring frame 40. The portion 44 of the ring frame 40 is exposed from the encapsulant 50. The encapsulant 50 may be formed by a molding operation. Referring to FIG. 5F, a grinding operation is performed to remove a portion of the encapsulant 50 to expose conductive elements (or electrical contacts) 22 of the electronic component 20 and conductive elements 32 (or electrical contacts) of the electronic component 30. A portion of the conductive elements 22 of the electronic component 20 and a portion of the conductive elements 32 of the electronic component 30 may be removed by the grinding operation. The portion 42 of the ring frame 40 is not exposed from the encapsulant 50. The portion 42 of the ring frame 40 is spaced apart from a surface 501 of the encapsulant 50 by a portion of the encapsulant 50. In some embodiments, because the portion 42 of the ring frame 40 is not ground in the grinding operation, the yield of the grinding operation can be improved and the life of the grinding tool can be extended.

Figure 5G:
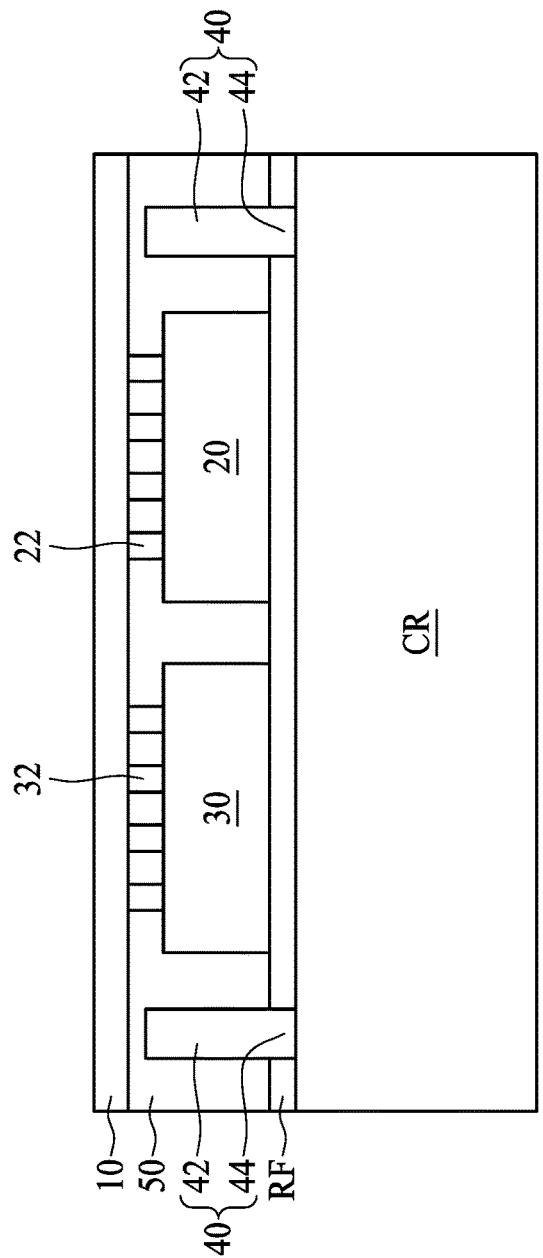

Referring to FIG. 5G, a substrate (which may be or may include a redistribution layer) 10 is disposed on the encapsulant 50 and the electronic components 20 and 30. The substrate 10 is in contact with the conductive elements 22 of the electronic components 20 and the conductive elements 32 of the electronic components 30. The substrate 10 may be electrically connected to the conductive elements 22 of the electronic components 20 and the conductive elements 32 of the electronic components 30.

Figure 5H:
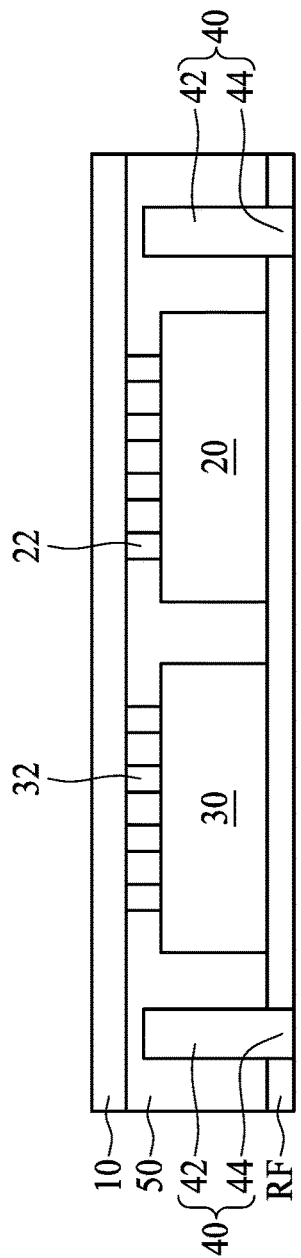
Figure 5I:
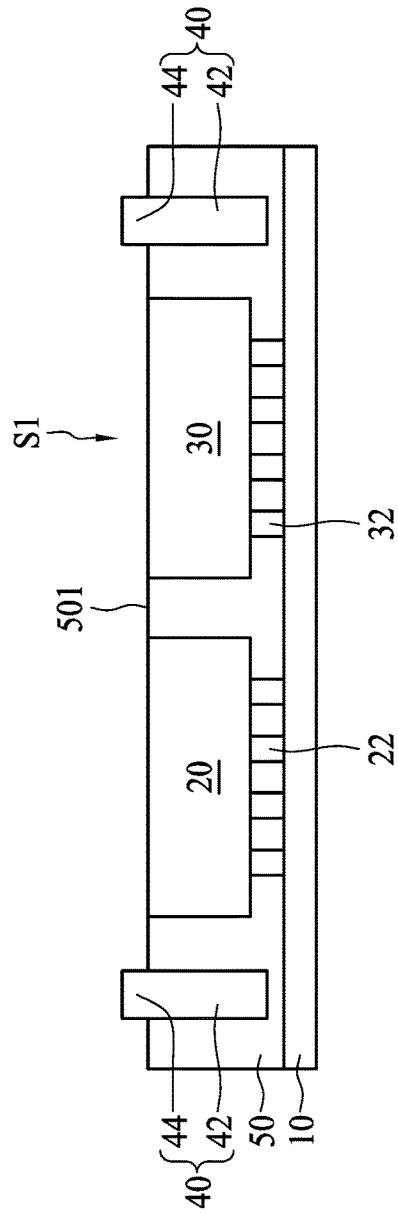

Referring to FIG. 5H, the carrier CR is removed, wherein an ultraviolet operation may be utilized. Referring to FIG. 5I, the release film RF is removed, wherein an ultraviolet operation may be utilized. A space (or accommodating space) S1 is formed between the surface 501 of the encapsulant 50 and the portion 44 of the ring frame 40.

Figure 5J:
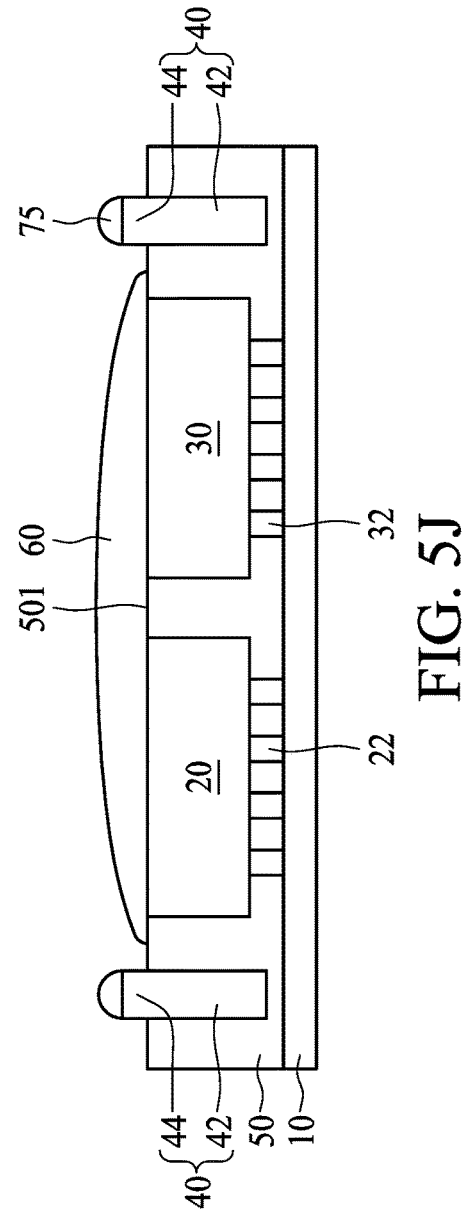
Figure 5K:
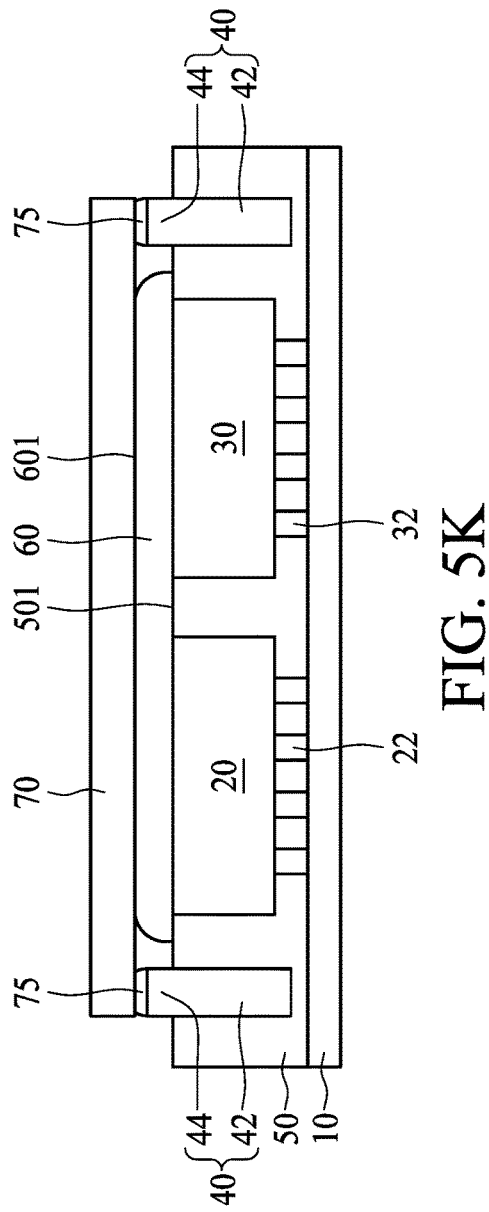

Referring to FIG. 5J, a thermal conducting material 60 is disposed in the space S1. The thermal conducting material 60 is disposed on the electronic components 20 and 30 and the encapsulant 50. The thermal conducting material 60 may be disposed by a dispensing operation. An adhesive material 75 is disposed on the portion 44 of the ring frame 40. The adhesive material 75 may be disposed by a dispensing operation. Referring to FIG. 5K, a lid 70 is disposed on the thermal conducting material 60 and on the portion 44 of the ring frame 40. The lid 70 is disposed on the portion 44 of the ring frame 40 by the adhesive material 75. The thermal conducting material 60 is pressed by the lid 70. The thermal conducting material 60 fully covers the electronic components 20 and 30. A surface 601 of the thermal conducting material 60 is fully in contact with the lid 70 and fully covers the electronic components 20 and 30 from a top view perspective.

Figure 5L:
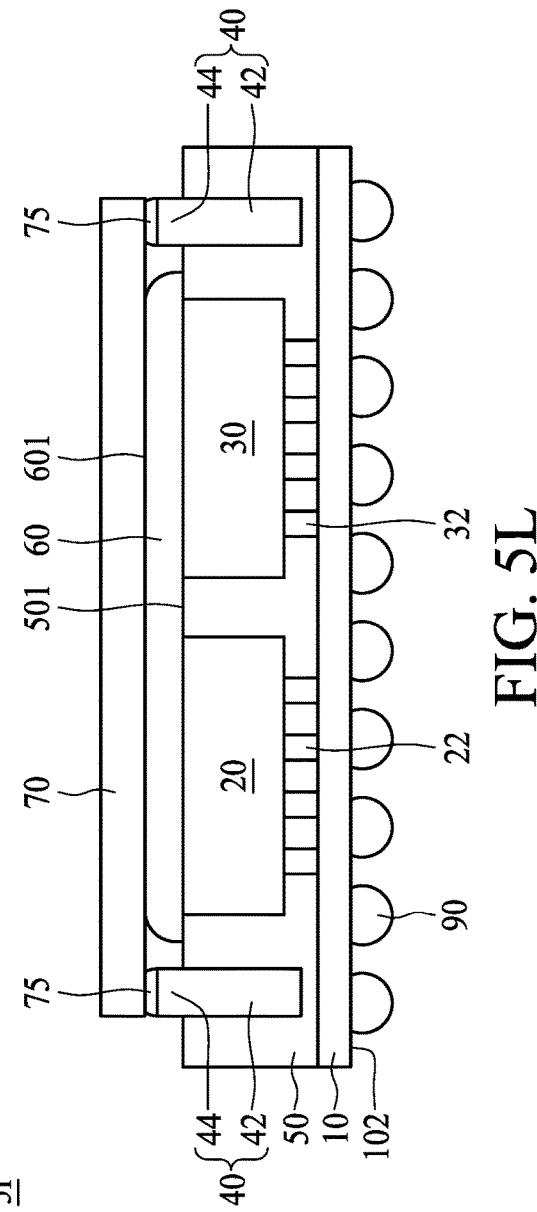

Referring to FIG. 5L, connection elements 90 are disposed on a surface 102 of the substrate 10. The connection elements 90 may be disposed by a ball mount process which may include a reflow operation. A semiconductor package device 51 is formed. The semiconductor package device 51 may be similar to or the same as the semiconductor package device 2a of FIG. 2A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a difference between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a substrate;
    an electronic component disposed on the substrate;
    a ring frame disposed on the substrate, the ring frame surrounding the electronic component;
    an encapsulant encapsulating the electronic component and a first portion of the ring frame and exposing a second portion of the ring frame, wherein the encapsulant and the second portion of the ring frame define a space;
    a thermal conducting material disposed in the space; and
    a lid disposed on the thermal conducting material and connecting with the second portion of the ring frame.

2. The semiconductor package device of claim 1, wherein the second portion of the ring frame fully surrounds the thermal conducting material.

3. The semiconductor package device of claim 1, wherein a portion of the electronic component is exposed from the encapsulant and contacts the thermal conducting material.

4. The semiconductor package device of claim 3, wherein the thermal conducting material contacts the lid.

5. The semiconductor package device of claim 4, wherein the thermal conducting material has an upper surface contacting the lid and the electronic component is within a contour of the upper surface of the thermal conducting material from a top view perspective.

6. The semiconductor package device of claim 1, wherein the ring frame is electrically connected to the substrate.

7. The semiconductor package device of claim 1, wherein the ring frame contacts the substrate.

8. The semiconductor package device of claim 1, wherein the lid connects with the second portion of the ring frame by an adhesive material.

9. The semiconductor package device of claim 8, wherein the adhesive material is discontinuously disposed between the second portion of the ring frame and the lid.

10. The semiconductor package device of claim 1, wherein a distance between a top surface of the encapsulant and the lid is greater than a height of the second portion of the ring frame.

11. The semiconductor package device of claim 10, wherein a ratio of the distance between the top surface of the encapsulant and the lid to the height of the second portion of the ring frame is equal to or greater than 0.7 and less than 1.

12. A semiconductor package device, comprising:
    a substrate;
    an electronic component disposed on the substrate;
    a ring frame disposed on the substrate and surrounding the electronic component;
    an encapsulant encapsulating the electronic component and exposing a backside surface of the electronic component, wherein the encapsulant has a first top surface and a second top surface separated from each other by the ring frame;
    a thermal conducting material disposed on the backside surface of the electronic component and surrounded by the ring frame; and
    a lid disposed on the ring frame and in contact with the thermal conducting material,
    wherein a projection area of the thermal conducting material on the substrate is greater than a projection area of the electronic component on the substrate.

13. The semiconductor package device of claim 12, wherein the encapsulant covering a first portion of the ring frame and exposing a second portion of the ring frame, and wherein the second portion of the ring frame, the lid and the encapsulant define a space to accommodate the thermal conducting material.

14. The semiconductor package device of claim 13, wherein a distance between the first top surface of the encapsulant and the lid is greater than a height of the second portion of the ring frame.

15. The semiconductor package device of claim 14, wherein a ratio of the distance between the first top surface of the encapsulant and the lid to the height of the second portion of the ring frame is equal to or greater than 0.7 and less than 1.

16. The semiconductor package device of claim 12, wherein at least a portion of the first top surface of the encapsulant is in contact with the thermal conducting material and the second top surface of the encapsulant is isolated from the thermal conducting material.

17. The semiconductor package device of claim 12, further comprising an adhesive layer connecting the lid to the ring frame.

18. The semiconductor package device of claim 12, wherein the thermal conducting material has an upper surface contacting the lid and the electronic component is within a contour of the upper surface of the thermal conducting material from a top view perspective.

19. The semiconductor package device of claim 12, wherein the ring frame is electrically connected to the substrate.

* * * * *